United States Patent
Jaso et al.

[11] Patent Number: 5,854,140
[45] Date of Patent: Dec. 29, 1998

[54] METHOD OF MAKING AN ALUMINUM CONTACT

[75] Inventors: Mark A. Jaso, Yorktown Heights, N.Y.; Herbert Palm, Hehenkirchen-Siegertsbrunn; Hans Werner Poetzlberger, Munich, both of Germany

[73] Assignees: Siemens Aktiengesellschaft, Munich, Germany; International Business Machines Corporation, Armonk, N.Y.

[21] Appl. No.: 764,382

[22] Filed: Dec. 13, 1996

[51] Int. Cl.$^6$ .................................................. H01L 21/302
[52] U.S. Cl. .................. 438/740; 438/633; 438/645; 438/699; 438/701
[58] Field of Search .................................... 438/702, 703, 438/713, 740, 734, 743, 723, 699, 626, 631, 633, 645

[56] References Cited

U.S. PATENT DOCUMENTS

| | | | |
|---|---|---|---|
| 4,698,128 | 10/1987 | Berglund et al. | 438/713 |
| 4,944,836 | 7/1990 | Beyer et al. | 156/645 |
| 4,985,374 | 1/1991 | Tsuji et al. | 437/229 |
| 5,093,279 | 3/1992 | Andreshak et al. | 437/173 |
| 5,209,816 | 5/1993 | Yu et al. | 156/636 |
| 5,256,565 | 10/1993 | Bernhardt et al. | 437/228 |
| 5,354,386 | 10/1994 | Cheung et al. | 148/33.3 |
| 5,422,310 | 6/1995 | Ito | 437/192 |
| 5,429,989 | 7/1995 | Fiordalice et al. | 437/190 |
| 5,512,163 | 4/1996 | Warffield | 205/109 |
| 5,597,341 | 1/1997 | Kodera et al. | 451/5 |

*Primary Examiner*—Benjamin Utech
*Assistant Examiner*—George Goudreau
*Attorney, Agent, or Firm*—Stanton C. Braden

[57] ABSTRACT

A method of forming aluminum contacts of submicron dimensions wherein, after formation of both vias and line openings in a silicon oxide layer, a metal stop layer is deposited, followed by deposition of aluminum. Alternatively, the metal stop layer is deposited prior to forming the vias and line openings. The excess aluminum is removed by chemical-mechanical polishing, the stop layer providing high selectivity to the chemical mechanical polishing. The stop layer is then removed. The resultant silicon oxide-aluminum surface is planar and undamaged by the chemical-mechanical polishing step.

11 Claims, 2 Drawing Sheets

METHOD OF MAKING AN ALUMINUM CONTACT

This invention relates to a method of making aluminum vias and contacts for integrated circuits. More particularly, this invention relates to a damascene process for removing excess aluminum from integrated circuit surfaces.

BACKGROUND OF THE INVENTION

Aluminum is widely used as a conductive metal in making integrated circuits because of its high conductivity and low temperature of deposition. Aluminum is used for making contacts between multi-layer devices, and for making conductive lines to connect devices to each other. Aluminum can be deposited by sputtering at low temperatures, thus leaving undisturbed prior formed devices and parts of devices.

In the manufacture of transistors for example, source and drain layers are formed by ion implantation or diffusion, gates are formed there between, and the whole is covered with an insulating layer, such as a silicon dioxide passivation layer, which is planarized. An aluminum layer is patterned to form aluminum lines to connect the devices to each other. A second silicon oxide layer can be deposited and a second layer of metal lines can be formed over the first layer.

In order to connect the two layers of metal lines, openings are formed in the silicon dioxide layer above the first level of conductive lines. These openings are to be filled with conductive metal, such as aluminum, to connect the two layers of lines to each other.

In accordance with the so-called dual damascene process, two sequential photoresist and etch steps are used to form a first opening or via to an underlying metal line, and a second in-line opening is made to form a conductive line above the via. Thus two photoresist patterning and etch steps are used to form a combined via and line in the silicon dioxide layer. Both openings are then filled with aluminum. By combining the vias and lines or interconnects, only one aluminum sputter deposition step is required to fill the vias and interconnects. This reduces the cost and time needed for this process. Further, since there is no interface between the vias and interconnects, electromigration of the aluminum interconnect is reduced, and the electrical properties, such as contact resistance, are also improved.

After the opening has been filled with aluminum, generally deposited by sputtering or chemical vapor deposition (CVD), the excess aluminum over the contacts and lines and the surface of the silicon dioxide must be removed. This is conventionally done by mechanical polishing, or chemical-mechanical polishing (hereinafter CMP). A polishing pad is used together with a polishing slurry containing an abrasive material, and the excess aluminum is scrubbed away. Since some aluminum may remain on the surfaces surrounding a trench or opening, the surface of the silicon dioxide is over-polished to remove all of the excess aluminum.

As the number of devices on a single semiconductor substrate become larger and as the devices become smaller and closer together, the overlying conformal aluminum layer also becomes more irregular. Irregularities in the aluminum layer makes it more difficult to polish the aluminum so as to form a planar layer without damaging or eroding the underlying silicon dioxide layer.

Thus an improved method of removing excess aluminum on a silicon oxide surface has been sought.

SUMMARY OF THE INVENTION

We have found that a metal stop layer, deposited prior to the aluminum, permits all the excess aluminum to be removed without erosion of the underlying silicon dioxide surface. Refractory metals can be used for this stop layer. After all the excess aluminum has been polished off, the refractory metal layer is removed by etching, such as by wet or dry etching, or a second polishing step selective to the underlying silicon dioxide, leaving smooth, planar, undamaged silicon dioxide surfaces. The refractory metals employed herein as stop layers provide enhanced selectivity between the aluminum and the substrate for the polishing step. As a result, a smooth, planarized layer of silicon dioxide is obtained after removal of the excess aluminum.

DETAILED DESCRIPTION OF THE INVENTION

As previously discussed, the invention relates to the formation of interconnects that result in a smooth, planarized surface. For purposes of illustration, the invention is described in the context of forming aluminum interconnects using a damascene process. However, the invention is significantly broader and extends to the fabrication of devices in general.

Figure 1:
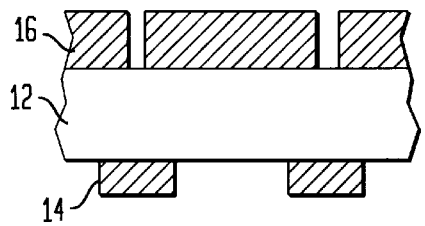
FIG. 1 is a cross sectional view of a patterned silicon dioxide layer.

In one embodiment of the invention, a silicon dioxide layer 12 is deposited over a first patterned conductive metal layer 14 and planarized if required. A photoresist layer 16 is deposited over the silicon dioxide layer 12 and patterned so that openings are made above the conductive metal 14. This patterned layer is shown in FIG. 1.

Figure 2:
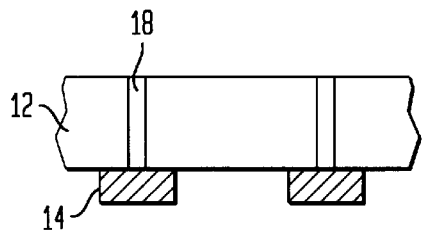
FIG. 2 is a cross sectional view of a silicon dioxide layer after etching openings to a first conductive metal layer.

The silicon dioxide layer 12 is then etched in a known manner to form an opening or via 18 to the first metal layer 14. Suitable etchants include, for example, $CF_3H$, $CH_3Cl$, $CF_4$, and the like. The first photoresist layer 16 is removed. This step is shown in FIG. 2.

Figure 3:
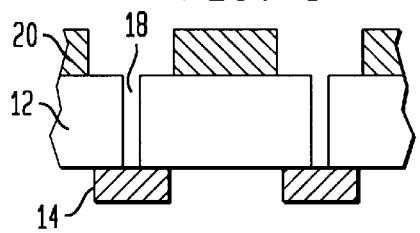
FIG. 3 is a cross sectional view of a second patterning layer of photoresist.

A second photoresist layer 20 is then deposited and patterned so as to form openings above the prior formed vias, as shown in FIG. 3.

Figure 4:
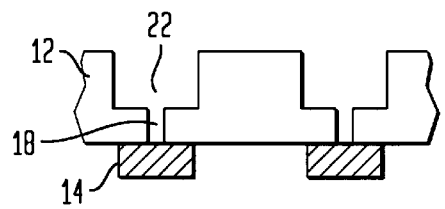
FIG. 4 is a cross sectional view of a silicon dioxide layer after the second etch step.

A second etch is performed in the silicon dioxide layer 12, this time only partially through the layer. These openings 22 are made somewhat wider than the original vias to ensure alignment of the openings that will accommodate line connections. The second photoresist layer 20 is then removed. This is shown in FIG. 4.

A metal stop layer 24 is then deposited by conventional techniques such as, for example, sputtering or evaporation. Such techniques are described in S. M. Sze, *VLSI*

Figure 5:
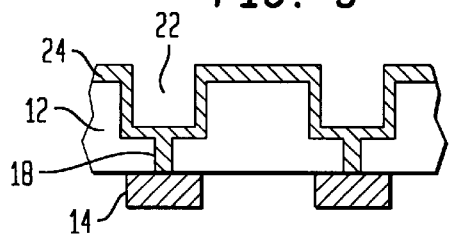
FIG. 5 is a cross sectional view of a silicon dioxide layer after deposition of a stop layer.

*Technology*, 2nd ed., New York, McGraw-Hill, 1988, which is herein incorporated by reference for all purposes. The metal stop layer 24 covers the surface of the silicon dioxide and at least part of the sidewalls of the openings and vias 18, 22, as shown in FIG. 5. The metal stop layer is sufficiently thick to effectively allow the subsequent CMP process to remove and planarize the excess aluminum without exposing the silicon dioxide layer 12. The thickness of the metal stop layer should allow enough opening in the via to effectively fill it with aluminum without voids. In addition, the metal stop layer serves as a liner for the aluminum. As such, the thickness of the metal stop layer should be thin enough to maintain the aluminum to a resistivity at or below a desired level. Preferably, the metal stop layer should be as thin as possible without exposing the silicon dioxide layer during CMP to remove the excess aluminum. In one embodiment, the thickness of the metal layer is about 200–400 Å.

Figure 6:
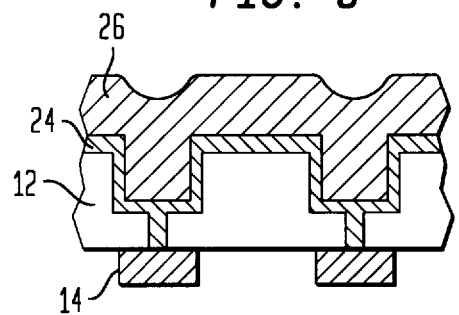
FIG. 6 is a cross sectional view of a silicon dioxide layer after filling the openings with aluminum.

An aluminum layer 26 is then deposited over the metal stop layer 24 to fill the openings and vias 18, 22. The aluminum layer is not planar, but somewhat conformal over the openings. The filled openings are shown in FIG. 6. By combining the vias and interconnects, only one aluminum sputter deposition is used to fill both the vias and interconnects in the same step. This has additional advantages. Since there is no interface between the vias and interconnects, electromigration of the aluminum interconnect is reduced and the electrical properties, such as contact resistance, are also improved.

Figure 7:
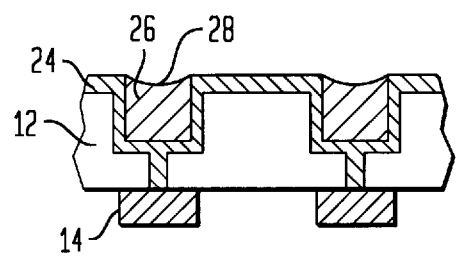
FIG. 7 is a cross sectional view of a silicon dioxide layer after chemical mechanical aluminum polishing.

The excess aluminum layer 26 is then treated with CMP to remove the excess aluminum from the surface of the silicon dioxide layer, leaving the metal stop layer 24 exposed on the surface. This step is shown in FIG. 7. Typically, the CMP causes dishing 28 in the aluminum, leaving the aluminum slightly depressed with respect to the metal stop layer.

Figure 8:
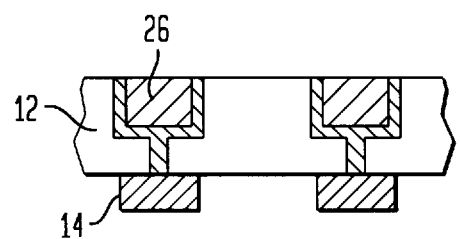
FIG. 8 is a cross sectional view of a silicon dioxide layer after removal of the stop layer.

The exposed metal stop layer 24 is then removed using conventional etching or polishing techniques such as those described in, for example, *VLSI Technology*, which is already herein incorporated by reference for all purposes. The etch or polish removes the metal layer while substantially leaving the aluminum unaffected. Since the aluminum is slightly depressed as a result of the dishing caused by the CMP, the etch or polish produces a substantially planar, undamaged silicon dioxide-aluminum layer 12, 26, as shown in FIG. 8.

The present process is particularly useful for making high density, multi-level devices, such as 64M and 256M DRAM devices.

Figure 9:
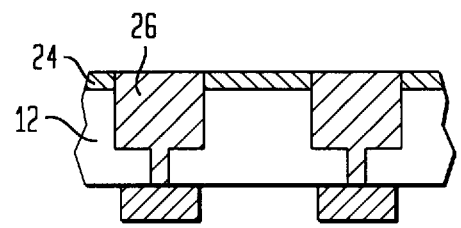
FIG. 9 is a cross-sectional view of an alternative embodiment of the invention.

FIG. 9 shows an alternative embodiment of the invention. As shown, a silicon dioxide layer 12 is deposited and a metal stop layer 24 is deposited thereover. A photoresist layer is then deposited and patterned and the silicon dioxide layer 12 is etched to form the openings for a contact/via to be made. The metal stop layer 24 is deposited over the silicon dioxide prior to the formation of via/interconnect openings. As a result, the sidewalls of the trench/via openings are not lined with the metal stop layer. The trenches/vias are then filled with, for example, aluminum 26.

Typically, a liner is formed on the sidewalls before filling the trenches/vias. The liner serves as a diffusion barrier. In addition, the liner serves as a wetting agent for aluminum to facilitate the filling of the trenches/vias without forming voids. Formation of voids are more prevalent in trenches/vias with high aspect ratios. In some embodiments, the liner comprises, for example, titanium (Ti) or titanium nitride (TiN).

Aluminum is sputtered onto the surface of the patterned layer. After sputtering, the aluminum is heated to a temperature sufficient to cause it flow into the trenches/vias by surface diffusion. Typically, the temperature at which the aluminum is heated is about 400°–550° C. As the aluminum fills the trenches/vias, the surface becomes irregular with steps and depressions being formed thereon.

For example, for a via of 0.25 micron dimension and an overlying trench of 0.3 micron dimension 0.5 micron deep, an 800 nm thick aluminum layer 26 after flow will produce steps or depressions on the surface of the patterned silicon dioxide up to about 400 nm high using a standard aluminum deposition process. The substrates are then subjected to a CMP process to form the conductive metal lines. However, this process has low selectivity between the aluminum and silicon dioxide and/or titanium. The result is that the aluminum lines can vary in thickness from about 170 to 370 nm across a silicon wafer, and the variation depends on the pattern density, the CMP center-to-edge non-uniformity of the polishing removal rate, and variations which are inherent to the CMP process, e.g., the pad used, the slurry used and the like. Further, the conductivity properties of aluminum vary because of the formation of $TiAl_3$ when Ti is used as a wetting layer. The thickness variation and resistance variation of the aluminum lines are directly correlated; when the aluminum line is thin, the higher resistivity $TiAl_3$ layer becomes a greater percentage of the Ti/Al structure. This adversely affects the resistance of the aluminum line as the aluminum thickness is reduced.

For very small lines and spaces, i.e., 0.25 micron vias or spaces and 0.3 micron lines, the resistance can vary from 0.2 to 0.8 ohm/sq, or more than 100%. This variation is not acceptable.

The present process, which provides a metal stop layer prior to depositing aluminum, reduces these thickness and resistance variations, even over densely packed metal lines, and provides a smooth, planar silicon dioxide surface after removal of the stop layer, or immediately after the deposition of silicon dioxide.

This stop layer can be deposited instead of, or in addition to, a conventional barrier layer, generally of TiN, in the vias and lines.

In order to sequentially form the vias and spaces, and to fill the vias and spaces with the stop and optional barrier layer and then with aluminum, a multi-chamber vacuum system can be employed, so that the substrate is treated sequentially in a single vacuum system comprising multiple deposition and etch processing chambers connected to a transfer chamber.

The stop layer is also deposited by sputtering. In order to sputter conformal layers into very small openings, i.e., vias and lines, the metal stop layer can be sputtered using a collimator. However, when a high molecular weight metal, such as refractory metals, are used to form the metal stop layer, the collimator can be eliminated.

In one embodiment, the metal stop layer comprises a material that is selective to aluminum when polished or etched. Selectivity to aluminum enables the removal of the metal stop layer without damage to the aluminum filled lines or the underlying silicon oxide layer. Suitable material for the metal stop layer includes, for example, titanium, tungsten, hafnium, zirconium, niobium, tantalum, molybdenum or combinations or composites thereof.

The metal stop layer is removed by conventional dry etching, wet etching, or a CMP polishing using a slurry chemistry that will remove the planar metal stop layer.

The invention produces aluminum lines and vias having substantially uniform resistivity independent of the pattern density across a wafer and from wafer to wafer. In addition, the metal stop layer results in an increased polishing window because of the high selectivity of the metal stop layer. Further, because an overpolish is possible without erosion of the aluminum, the trench depth is conserved and the thickness of the silicon oxide layer can be reduced. Traditionally silicon dioxide layers are about 1 micron thick; this can be reduced by use of the present process using a stop layer to about 5000Å thick. The use of thinner silicon dioxide layers results in shorter etching time for etching the vias. Also, thinner photoresist layers can be used, reducing the time for removal of the patterned photoresist layers. Furthermore, since the aspect ratio of the vias is less, the vias and trenches are more easily and more completely filled with aluminum without the formation of voids.

While the invention has been particularly shown and described with reference to various embodiments, it will be recognized by those skilled in the art that modifications and changes, such as employing additional device processing steps and/or materials, may be made to the present invention without departing from scope thereof. The scope of the invention should therefore be determined not with reference to the above description but with reference to the appended claims along with their full scope of equivalents.

We claim:

1. A method of forming aluminum contacts in an integrated circuit comprising:
   a) providing a silicon dioxide layer over a portion of the surface of a semiconductive substrate;
   b) forming vias in the silicon dioxide layer;
   c) depositing a photoresist layer on the silicon dioxide layer and patterning the photoresist layer to form openings above the vias and larger than the vias;
   d) partially etching through the silicon dioxide layer to form openings in the silicon dioxide layer larger than the vias and removing the photoresist layer;
   e) depositing a metal stop layer over the silicon dioxide layer and at least part of the sidewalls of the vias and openings, said metal being one that will selectively resist chemical-mechanical polishing that will erode silicon dioxide and aluminum;
   f) depositing a layer of aluminum over the metal stop layer so that vias and openings are filled;
   g) chemical-mechanical polishing the aluminum layer down to the metal stop layer; and
   h) removing said metal stop layer where not covered by the aluminum layer.

2. A method according to claim 1 wherein the openings after step e) are coated with a titanium layer.

3. A method according to claim 2 wherein the openings are further coated with a titanium nitride layer.

4. A method according to claim 1 wherein said metal stop layer is a metal selected from the group consisting of tungsten, hafnium, zirconium, niobium, tantalum and molybdenum.

5. A method according to claim 4 wherein said metal stop layer is tungsten.

6. A method according to claim 1 wherein said aluminum layer is deposited by sputtering or chemical vapor deposition.

7. A method according to claim 6 wherein said aluminum layer is deposited by sputtering.

8. A method according to claim 6 wherein said aluminum layer is deposited by chemical vapor deposition.

9. A method according to claim 4 wherein said metal stop layer is sputter deposited.

10. A method according to claim 5 wherein the tungsten is sputter deposited.

11. A method of forming aluminum contacts comprising:
    a) providing a silicon dioxide layer;
    b) depositing a metal stop layer over the smooth surface portion of the silicon dioxide layer;
    c) forming vias in the silicon dioxide layer;
    d) depositing a photoresist layer on the silicon dioxide and patterning the layer to form openings above the vias and larger than the vias;
    e) using the patterned photoresist layer as a mask for in turn etching away the metal stop layer, then etching away a partial thickness of the silicon dioxide layer and then removing the photoresist layer;
    f) depositing a layer of aluminum so that vias and openings in the silicon dioxide layer are filled;
    g) chemical-mechanical polishing the aluminum layer down to the metal stop layer, polishing with a slurry that distinguishes between the etch rate of aluminum and that of the stop layer; and
    h) removing the remaining metal stop layer.

* * * * *